United States Patent [19]

Lorimer

[11] Patent Number: 5,063,609
[45] Date of Patent: Nov. 5, 1991

[54] STEAM GENERATOR

[75] Inventor: D'Arcy Lorimer, Santa Clara, Calif.

[73] Assignee: Applied Materials, Inc., Santa Clara, Calif.

[21] Appl. No.: 419,865

[22] Filed: Oct. 11, 1989

[51] Int. Cl.[5] .............................................. F22B 1/28
[52] U.S. Cl. .................................... 392/401; 392/394
[58] Field of Search ............... 392/400, 401, 394, 386, 392/402

[56] References Cited

U.S. PATENT DOCUMENTS

| | | | |
|---|---|---|---|
| 2,179,781 | 11/1939 | Frankel | 392/401 |
| 2,336,011 | 12/1943 | Haberstump | 392/401 |
| 2,391,071 | 12/1945 | Price | 392/401 |
| 2,616,023 | 10/1952 | Meyer | 392/391 |
| 2,627,015 | 1/1953 | Hackman | 392/401 |
| 3,110,797 | 11/1963 | Vanne | 392/399 |
| 4,186,032 | 1/1980 | Ham | 134/31 |
| 4,266,116 | 5/1981 | Bauer | 392/324 |
| 4,575,613 | 3/1986 | Kunzli | 392/332 |
| 4,759,315 | 7/1988 | Chiou et al. | 122/442 |
| 4,767,502 | 8/1988 | Santasalo et al. | 202/174 |

FOREIGN PATENT DOCUMENTS 0284052 9/1988 European Pat. Off. .

Primary Examiner—Teresa J. Walberg
Attorney, Agent, or Firm—Thomas Schneck

[57] ABSTRACT

A steam generator has a plurality of vertically oriented boiling chambers. Feed water enters the top chamber and cascades down through drain tubes to the lower chambers. The bottom chamber has a drain to remove excess feed water. Each chamber has a feed water reservoir in which an electrical coil causes gentle boiling. The steam produced in each chamber is substantially free of droplets and is allowed to rise to the top chamber through steam passageways. A steam outlet in the top chamber allows the steam to be released for use in semiconductor wafer cleaning systems and other applications requiring pure steam. The steam generator may be formed by stacking modular units together.

25 Claims, 3 Drawing Sheets

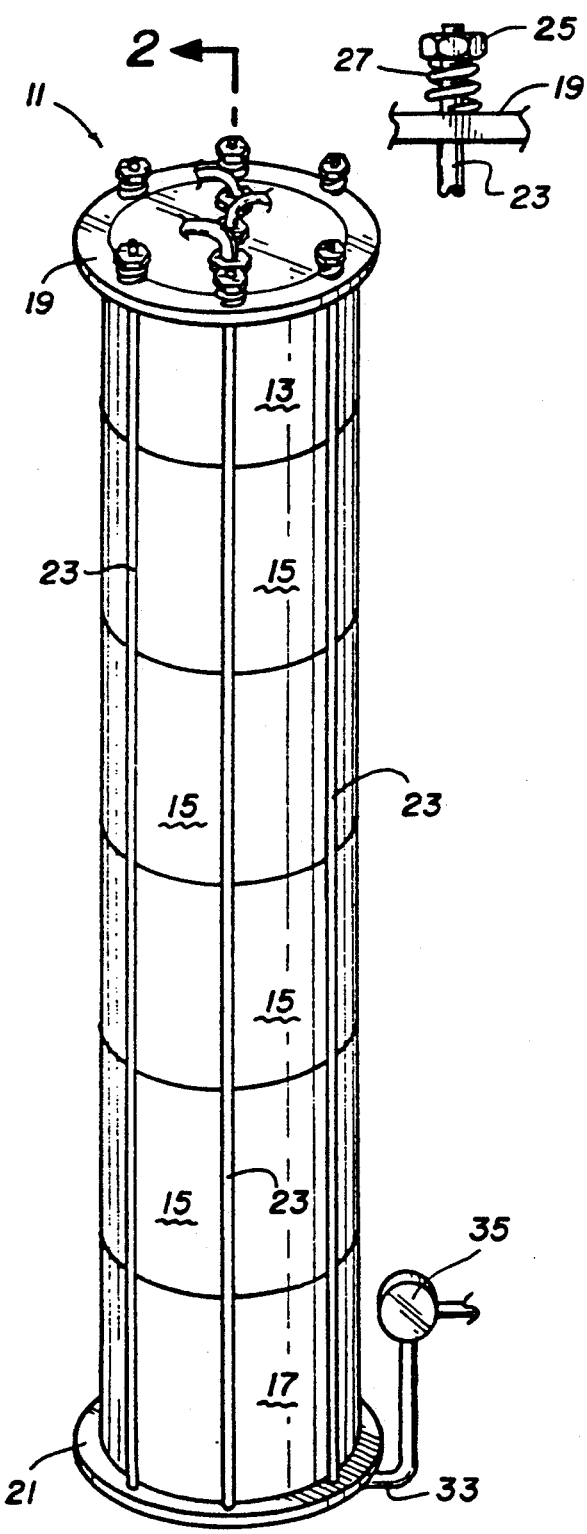
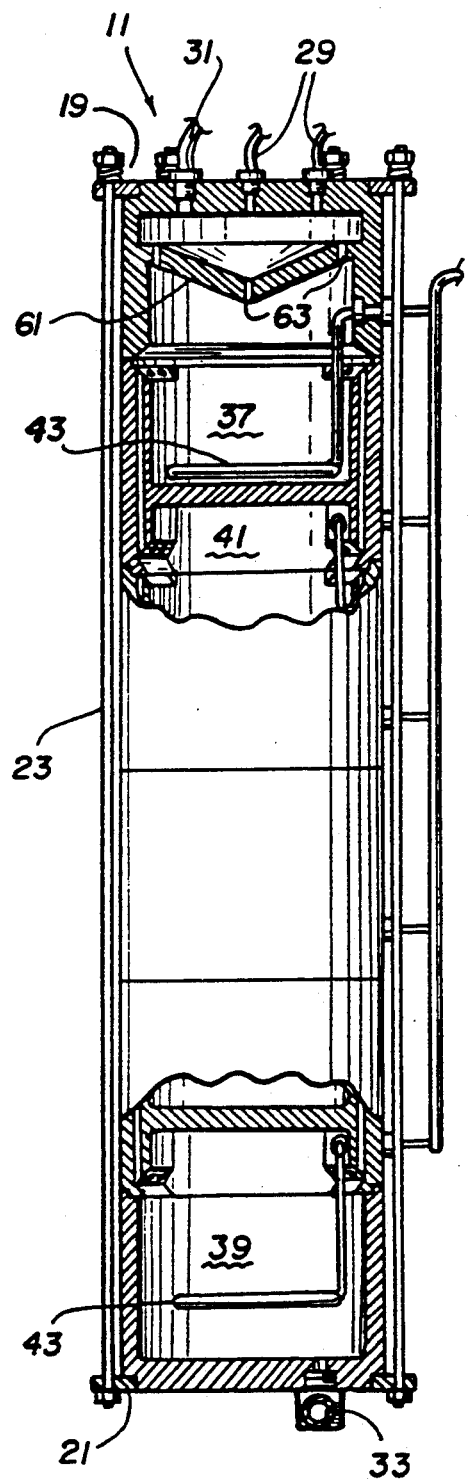

STEAM GENERATOR

TECHNICAL FIELD

The present invention relates to apparatus and methods for producing and utilizing pure steam.

BACKGROUND ART

Interest in using steam for cleaning semiconductor surfaces has increased in recent years due to the environmental concerns raised over the use of certain hazardous chemical solvents commonly used in the semiconductor industry. Moreover, the problem and cost of properly disposing these hazardous chemicals is becoming increasingly prohibitive. Therefore, alternatives to these hazardous chemicals have been sought.

An example of using steam to clean the surface of a semiconductor wafer is found in U.S. Pat. No. 4,186,032, issued to Ham. Here superheated steam is passed over the wafer and condensate is allowed to form and drip off the wafer.

With improved semiconductor fabrication techniques the size of the semiconductor components has continually decreased. Smaller sized components have necessitated improved cleaning methods and apparatus, since extremely small particles can interrupt a circuit. For methods using steam this has meant improving the purity of the steam used.

A common type of steam generator may be termed a batch type boiler. These boilers have the characteristic of having a feed water inlet and a steam outlet. With time impurities build up in the boiler water which can contaminate the steam. Therefore the boiler must be periodically flushed and cleaned out.

In U.S. Pat. No. 4,767,502, to Santasalo et al., a pure steam generator is disclosed which is particularly adapted for steam sterilizing products of the pharmaceutical industry. The steam generator of Santasalo et al. includes a feed water line, an electrode system for heating the feed water, a steam outlet and a droplet separator. Here a major consideration was providing a fast acting electric steam generator. The solution to this was found in enclosing the electrodes in small tubular spaces. This arrangement effectively reduces the thermal mass seen by the electrode and results in the desired rapid boiling. However, rapid boiling causes significant entrainment of droplets in the steam. To remove the droplets a long tortuous path is provided, which reduces the overall efficiency of the steam generator.

Moreover, a further loss of efficiency occurs with vigorous boiling. Theoretically once water reaches the point of boiling, all additional energy goes into converting the water into steam. In actuality the more vigorous or rapid the boiling is, the less efficient the conversion becomes. That is, with each incremental increase in the amount of power going into the conversion process the smaller the increase in the amount of steam produced. Yet large amounts of pure steam are required in most semiconductor wafer cleaning applications. The difficulty in producing large amounts of pure steam without the problem of droplet entrainment has not heretofore been adequately addressed.

In European publication no. EP-0-284-052-A2 a method and apparatus for producing ultra-pure water are disclosed. The method uses a distillation process in which the water used is first heated to remove any volatile components in the water prior to distillation. The water from which the volatile components have been removed is then heated to produce steam which is filtered by a gas-pervious and liquid-impervious membrane after which the filtered steam is condensed. A quantity of the condensed water is maintained and made available for processes requiring pure water, such as cleaning semiconductor wafer surface and medical tools.

Sometimes a problem with bacteria growth arises with maintaining or storing water, even ultra pure water, to be used for cleaning. Therefore, cleaning methods involving ultra pure water may not be completely suitable for cleaning semiconductor wafer surfaces.

It is therefore an object of the present invention to design a steam generator which efficiently produces ultra high purity steam and which may be operated for long periods of time without a significant buildup of contaminants in the generator.

It is another object of the present invention to design a generator which converts large amounts of electrical power to steam.

It is another object of this invention to provide an ultra high purity steam cleaning system for semiconductor wafers.

SUMMARY OF THE INVENTION

The above objects have been met by a steam generator that has a plurality of vertically stacked chambers which have increased steam producing surfaces responsive to electrical power distributed among the chambers. The chambers stand atop one another and are interconnected by drain tubes and steam passageways such that feed water introduced at the top of the chambers cascades down through the chambers as steam rises to the top chamber. Each chamber maintains a feed water reservoir up to a certain level. When the feed water goes above that level it begins to flow through the drain tubes to the chamber below. Steam passageways set in the upper portion of the chambers extend upward into the next chambers, thus allowing steam to pass to the chambers above. A feed water drain in the bottom chamber removes excess feed water.

The steam generator described above may be advantageously incorporated in a semiconductor water cleaning system wherein the generated steam is used to clean a surface of a wafer. The system includes a heated supply line which includes a filter for removing any remaining liquid droplets and particles from the steam. The filtered steam is then directed to and allowed to form condensate on the wafer surface to be cleaned.

A central feature and advantage of the present invention is that the multiple chambers provide an increased ratio of feed water surface area to power input. An electric coil is placed in each chamber so that the total power going into the generator is evenly distributed among the chambers. The rated power of each coil is such that gentle boiling takes place in each chamber. This makes it possible to avoid vigorous boiling with its inherent problem of droplet entrainment, while still providing large amounts of pure steam. Another advantage is that the cascading feature of the feed water effectively reduces the amount of contaminant buildup within the steam generator by providing continuous flushing of each chamber. A further advantage is that in the wafer cleaning system described above it is more efficient to filter steam than liquid water. This benefit accrues because commercially available gas filters are effective in the range of parts per billion of contaminant particles, while liquid filters are not nearly as effective by several orders of magnitude. Moreover, the steam is condensed and utilized at the point of use, thereby substantially avoiding any problem of bacteria growth. These and other advantages and features are discussed in greater detail with relation to the drawings.

BRIEF DESCRIPTION OF THE DRAWINGS

FIG. 1 is a perspective view of a steam generator in accord with the present invention.

FIG. 2 is a partial cross sectional view of FIG. 1 taken along line 2—2.

FIG. 3 is an enlarged view of a support member shown in FIG. 1.

DETAILED DESCRIPTION OF THE INVENTION

Figure 4:
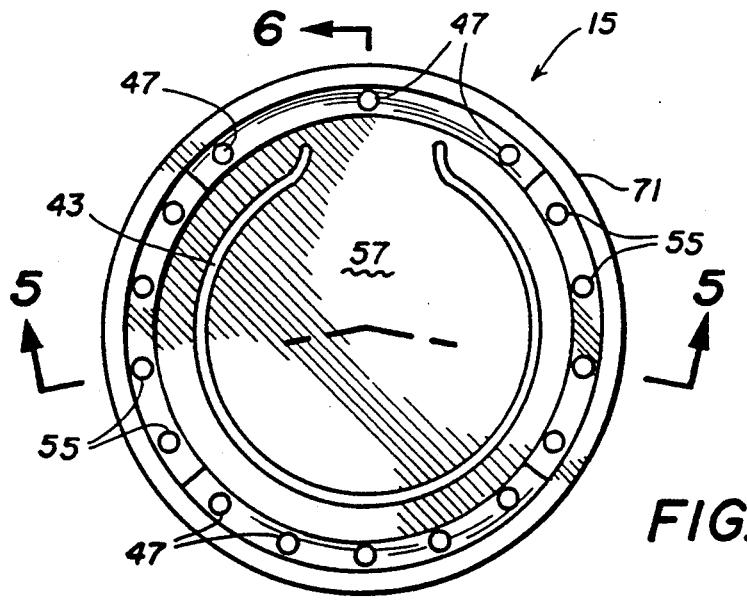
FIG. 4 is a top view of a middle unit shown in FIG. 1.
Figure 5:
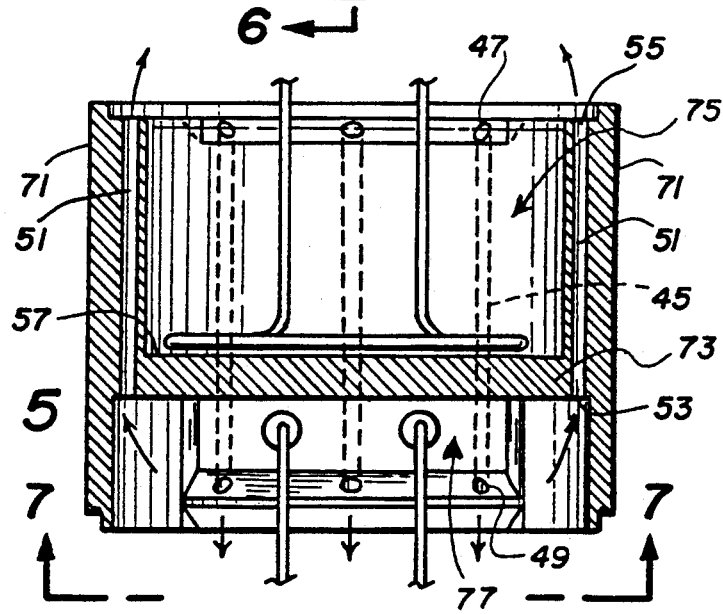
FIG. 5 is a cross sectional view taken along line 5—5 of FIG. 4.
Figure 6:
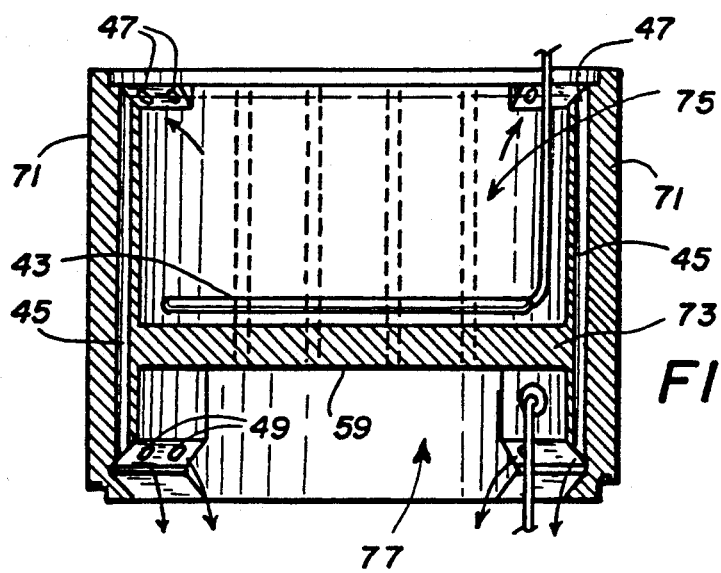
FIG. 6 is a cross sectional view taken along line 6—6 of FIG. 4.
Figure 7:
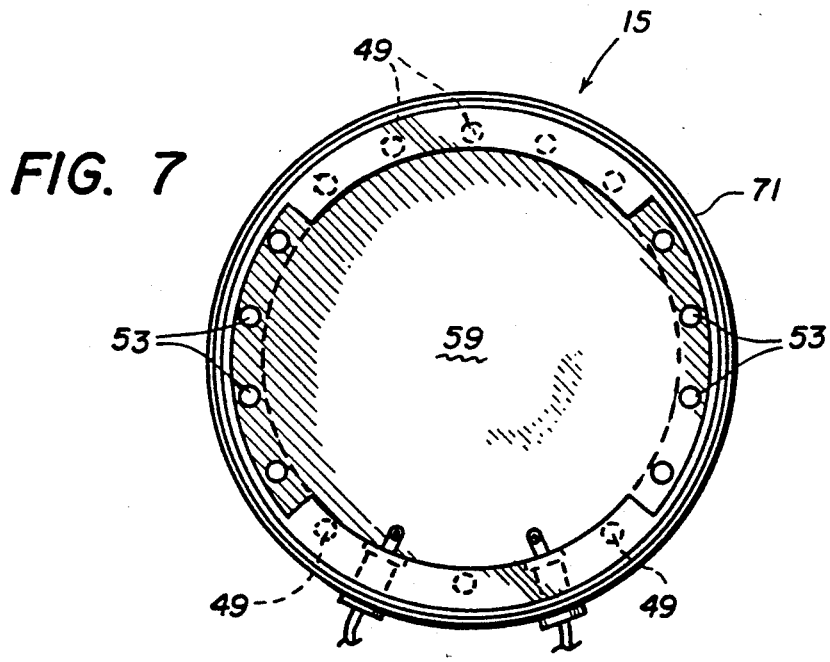
FIG. 7 is a bottom view of a middle unit taken along line 7—7 of FIG. 5.

Referring to FIG. 1, a multi-staged steam generator 11 is shown to comprise various modular units which form the outer housing and define the internal stages or chambers within the generator 11. In the embodiment shown, there is a top unit 13, four middle units 15 and a bottom unit 17. The middle units 15 are identical to each other. Stacked together these units 13, 15 and 17 form five chambers, some of which are shown in cross section in FIG. 2. The number of chambers in the present invention may be some number other than five depending on the amount of steam desired and other design considerations. Typically though there will be at least three separate chambers. An insulating jacket, not shown, may surround the stack.

To hold the stack together a top ring 19 and a bottom ring 21 are secured by several long extending bolts 23 fastened by nuts 25. A compression spring 27, shown in greater detail in FIG. 3, allows for thermal expansion. The stack may expand vertically by as much as one-half inch for a three to four foot high stack. Four bolts with springs having a k constant of 250 pounds per inch have proved adequate.

In the top of the generator 11 is a feed water inlet 29 through which feed water is supplied. Two feed water inlets 29 are shown, but more than one inlet is not necessary. Also in the top, is a steam outlet 31 through which steam is released. Attached to the base of the bottom unit 17 is a feed water drain 33 coupled to a control valve 35. Excess feed water is drawn off through the drain 33. The feed water is preferably ultra-high-purity (UHP), de-ionized water, but mixtures of isopropyl alcohol and deionized water are also appropriate.

Turning now to FIG. 2, in which some of the internal structure is shown, steam generator 11 is shown to include a top chamber 37 and a bottom chamber 39. The middle chambers 41 between the top and bottom chambers are similar to one another and are described more fully in relation to FIGS. 4–7. The top chamber 37 differs from the others, in that it includes a V-shaped partition 61 that includes apertures 63 which allow passage of feed water and steam. The partition 61 reduces the number of droplets that are released with the steam out of the top chamber through the steam outlet 31. Feed water is introduced into the top chamber through the inlet 29. The feed water cascades down through the chambers until it reaches the bottom chamber 39 where any excess is removed through feed water drain 33.

Each of the chambers has a heating coil 43 for heating the feed water and producing steam. Preferably the rated output of each coil 43 is about 1000 Watts, in which case the preferred surface area of the feed water in each chamber is about one square foot. Thus, the preferred surface area to power ratio is 0.25 $ft^2/kW$. Each coil 43 extends downward from the unit above. That is each coil 43 is attached to the unit above so that during assembly the coil slides down into the unit below. Two threaded holes 65 are provided in the upper units for electrical leads 67 connected to each coil 43. The coil 43 may be made of any of the known electrically resistive materials, but should be coated with a non-reactive material such as Teflon, which is a registered trademark of the Dupont Company.

Referring now to FIGS. 4–7, a middle unit 15 is shown and depicted to have a cylindrical sidewall 71 and a floor 73. The floor 73 divides the interior space of the unit into an upper and a lower volume. The upper volume forms a feed water reservoir 75 to an upper chamber and the lower volume forms a steam collecting area 77 to a lower chamber. The floor 73 has an underside 59 and a topside 57.

A plurality of drain tubes 45 are formed in the sidewall 71. The drain tubes 45 have entries 47 in the feed water reservoir 75, such that when the feed water reaches the entries 47 it overflows into the drain tubes 45 and falls through the drain tubes until it reaches an exit 49, whereupon it continues falling until it reaches the feed water reservoir of the lower chamber.

Also formed in the sidewall 71 are steam passageways 51 which allow steam from the steam collecting area 77 of the lower chamber to rise to the upper chamber. These steam passageways 51 have inlet ports 53 flush with the underside 59 of floor 73. The passageways 51 extend upwards into the upper chamber and end at outlet ports 55 at a point above where the feed water overflows.

Preferred materials for the steam generator are PFA Teflon which can be molded, PVDF (polyvinylidene fluoride) which can be machined and PEEK (poly ether ether ketone). PVDF is also known under the trademark Kynar owned by the Pennwalt Corp. When stacked together there may be a Teflon O-ring between the units for improved sealing. Teflon is a registered trademark for polytetrafluoroethylene.

With general reference to FIGS. 1–7, the steam generator 11 is assembled with modular units 13, 15 and 17. The modular design reduces manufacturing costs and provides flexible system capacity. The interior of the steam generator is divided into a number of vertically stacked chambers. Each chamber is designed to have a feed water reservoir 75 and an area for collecting steam 77. The network systems for the feed water and steam are discussed below.

UHP feed water is introduced into the top chamber 37 through the feed water inlet 29 and flows down through the apertures 63 of the partition 61 into the reservoir of the top chamber 37. When the level of the feed water in the reservoir reaches what is called the overflow level, the excess feed water drains down to the reservoir of the chamber immediately below and so on. Overflow drainage is accomplished by drain tubes 45 formed in the cylindrical side walls 71 of the top and middle units. Since the bottom chamber 39 does not have a lower chamber into which its excess water can drain, the bottom unit includes a feed water drain 33 and control valve 35. The valve may respond to an indication or signal of the level of feed water in the bottom chamber. During continuous operation the feed water flow rate is about 150 cc/min. and the amount of water converted into steam is about 80 cc/min.

Submersed in each reservoir is an electrical coil 43. To simplify the drawings only a single loop coil is shown. In actual use, the coil would have several loops and extend over nearly the entire area of the reservoir. In operation the output of each coil is generally between 1000 and 1200 Watts for a total power output of 5-6 kW, which will convert about 80 cc to 100 cc of water into steam per minute. The feed water boils gently because of the large surface area to power ratio, typically 0.25 $ft^2$/kW. The steam collects in the volume above the reservoir and rises into the chambers above through the steam passageways 51 set in the sidewall. The steam is then released through the steam outlet 31. The steam released is of an ultra high purity, suitable for applications requiring pure steam, such as is discussed below.

Figure 8:
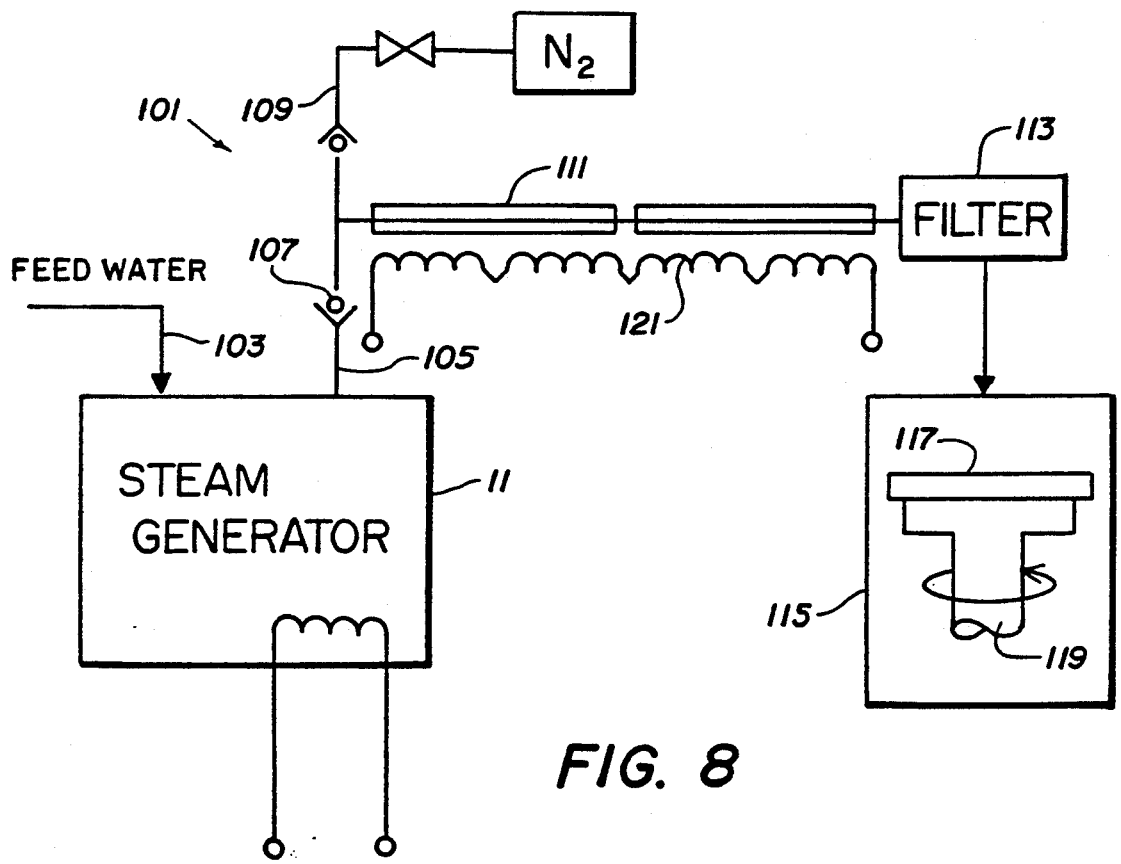
FIG. 8 is a schematic diagram of a wafer cleaning system in accordance with the present invention.

Referring to FIG. 8, a preferred semiconductor wafer cleaning system 101 is depicted. In this system ultra high purity, de-ionized water is input into the steam generator 11 through water supply line 103. A small percentage (less than 20% and preferably 5%-10% of the water volume input) of liquid isopropyl alcohol may also be input and may be preferred for most wafer substrates. Steam is generated as previously described, and is released out of the steam generator 11 through steam outlet line 105. When alcohol has been added, the steam is pure in the sense of being free from contaminants. The alcohol is not regarded as a contaminant and works in cooperation with the water derived steam. A valve 107 controls the release of the steam. A nitrogen gas supply line 109 joins the steam outlet line 105 to form supply line 111. Other inert gases may be used in place of nitrogen. The supply line 111 is heat traced and maintained at a temperature of 120° C. by heating element 121 so that there is no condensation. A droplet filter 113 in supply line 111 is used to remove any remaining droplets and contaminant particles from the steam and gas. A preferred filter 113 is a heated Teflon Millipore membrane filter with a hydrophobic sintered Teflon membrane. Millipore is a registered trademark of Millipore Corporation. This type of filter can remove sub-micron size liquid droplets and particles. The filter 113 should be sized according to the maximum desired flow rate and like the supply line 111 is heated to prevent condensation therein.

As previously noted, it is more efficient to filter steam than liquid water, both in terms of operation and in results. The efficiency of gas filters is well known and the present invention utilizes that efficiency, in multiple stages if necessary, to achieve ultra pure steam. On the other hand, the apparatus used to filter liquid water is more complicated and difficult to maintain than that which is required to filter steam. Often, to purify liquid water, one must go through the steps of coagulation-precipitation, filtration, microfiltration, reverse osmosis, de-aeration, ion exchange, ultraviolet germicidal step and finally ultrafiltration. Even with the distillation methods, the condensed water needs to be filtered, because of bacteria growth, before it can be used to clean semiconductor wafers. Thus, in both types of purifying methods the liquid water is or should go through ultrafiltration prior to use. However, ultrafiltration techniques are not as effective in removing impurities from liquid water as millipore membrane filtering is at removing impurities from steam.

After being filtered, the steam and nitrogen gas are introduced into a cleaning station 115 in which a vacuum chuck 119 supports a semiconductor wafer 117. The steam and nitrogen gas are advantageously used to remove contaminant particles from the wafer surface in the manner described below.

In a preferred wafer cleaning method there are three main steps: high velocity blasting, condensate forming and drying. To initialize the cleaning station 115, it is purged with an inert gas, such as nitrogen. Purging is followed by directing a short blast, lasting approximately 5 seconds, of nitrogen gas and steam at the wafer surface. The combined flow rate of the two gases is about 150 liters/min., or about 100 liters/min. steam and 50 liters/min. nitrogen.

The condensate forming step begins when the nitrogen gas is shut off and only the steam is directed at the wafer surface. The temperature of the wafer 117 is maintained by a fluid coil within the vacuum chuck 119. During the condensate forming step, and all other steps, the temperature of the fluid going into the coil is 60° C. The temperature of the fluid going out of the coil during condensation is about 80° C. The vacuum chuck 119 is rotatable so that as condensate forms on the wafer surface it is spun off by centrifugal forces. Thus, only a very thin layer of condensate is maintained on the wafer surface. Because of water's high degree of solvency, many of the contaminant particles on the wafer are put into solution. These particles are then spun or blasted off the wafer. The condensate forming step lasts for about 3 minutes, followed by a long blast, lasting approximately 30 seconds, of nitrogen gas and steam.

The wafer is dried by shutting off the steam and directing heated nitrogen gas at the wafer surface. Drying takes between 3 to 5 minutes. During the drying step the fluid going out of the coil in the vacuum chuck is about 100° C.

The timing of the condensate forming step and the drying step together with the other steps could be adjusted for two separate cleaning stations, such that a single steam generator, as previously described, could supply the needed steam in alternating fashion to each cleaning station. Such a system would nearly double the output and allow for nearly continuous steady state operation of the steam generator.

An advantage of the above-described cleaning system is that the fluid used to clean the wafer surface is condensate formed at the point of use. Prior methods have often used de-ionized water sprayed onto the wafer, but it is virtually impossible to keep bacteria from growing in the water. Bacteria can become a significant source of contaminant particles. Another advantage is that filtering a gas is simpler and more effective than filtering a liquid. Therefore, the steam produced by the present invention is, after being filtered, of ultra high purity.

I claim:
1. A steam generator comprising,
a plurality of stacked, interconnected, vertically-oriented liquid-holding chambers, there being a top chamber and a bottom chamber, each chamber having a sidewall and a bottom wall, means for introducing water into the top chamber, means within the sidewall of each of said chambers above the bottom chamber for communicating overflow water from a higher chamber to a lower chamber, the bottom chamber having a drain means for removing water reaching the bottom chamber, means for heating the water in each chamber to create steam in each of said chambers, said heating means immersed in liquid in each chamber, means for conducting said steam from a lower chamber to the chambers above, the steam migrating upwardly to a collection zone, means for releasing said steam from said collection zone.

2. The steam generator of claim 1 wherein said means for communicating overflow water from a higher to a lower chamber comprises a plurality of drain tubes, each of which has an entry in the higher chamber and an exit in the chamber immediately below, the entry being set at an overflow level in the higher chamber.

3. The steam generator of claim 1 wherein said means for conducting steam comprises a plurality of passages, each passage having an inlet in the uppermost portion of the lower chamber and an outlet in the chamber immediately above, the outlet being at a level above said overflow level.

4. The steam generator of claim 3 wherein said means for releasing said steam comprises a steam outlet in said top chamber.

5. The steam generator of claim 1 wherein said means for heating comprises an electrical resistive coil having a portion thereof below said overflow level.

6. The steam generator of claim 5 wherein each resistive coil converts approximately the same amount of electrical power to steam.

7. The steam generator of claim 1 wherein each chamber is made of non-metallic material.

8. The steam generator of claim 1 wherein each chamber has a cylindrical shape.

9. The steam generator of claim 1 wherein said water is combined with 5% to 10% of isopropyl alcohol.

10. The apparatus of claim 1 wherein said chambers are stacked one directly atop another.

11. A steam generator, comprising, a housing having a plurality of liquid holding walled chambers in cascading, gravity-feed-relation, there being a top chamber and a bottom chamber, each chamber having a sidewall and a bottom wall, means for introducing water into the top chamber, first passageway means defined in the sidewall of each of said chambers above the bottom chamber for feeding overflow water from a high chamber to the next lower chamber, the bottom chamber having a fluid drain means for removing said water therefrom, means for heating the water in each chamber to create steam in each of said chambers, said heating means immersed in liquid in each chamber, second passageway means defined in the sidewall of each of said chambers for conducting the steam from a lower chamber to the chambers above, and means for controllably releasing the steam from the top chamber.

12. The steam generator of claim 11 wherein said first passageway means for feeding overflow water from a higher chamber to a lower chamber comprises a first plurality of standing tubes defined in walls of said chambers, each with an entry in the higher chamber and an exit in the next lower chamber, the entry being set at an overflow level in the higher chamber.

13. The steam generator of claim 11 wherein said second passageway means for conducting steam comprises a second plurality of standing tubes defined in walls of said chambers, each having an inlet in the uppermost portion of the lower chamber and an outlet in the chamber immediately above, the outlet being at a level above said overflow level.

14. The steam generator of claim 11 wherein said means for heating is operationally adjustable to have a liquid surface area to power ratio greater than 0.2 $ft^2/kW$.

15. The steam generator of claim 14 wherein said means for heating comprises an electrical resistive coil disposed in each chamber with each coil having a portion thereof below said overflow level.

16. The steam generator of claim 11 wherein said housing comprises a plurality of vertically stackable units held together in biased compression.

17. A steam generator, comprising, a plurality of interconnecting, vertically-stackable modules which when stacked together define a plurality of vertically-oriented chambers, there being defined a top chamber and a bottom chamber, each of the chambers having a sidewall and a bottom wall forming a liquid reservoir therein, a feed water inlet that introduces feed water into the reservoir of the top chamber, a gravity feed network of standtubes in said sidewall having entries in a higher chamber and an exit in the chamber immediately below, the entries being at a reservoir overflow level, the bottom chamber having a feed water drain outlet responsive to levels of feed water within the reservoir of the bottom chamber, an electrical heating system having a resistive coil disposed within the reservoir of each chamber immersed in liquid therein, each coil producing sufficient energy to cause gentle boiling of the feed water, a network of steam passageways in direct communication with adjacent chambers, each passageway having an inlet port in the uppermost portion of a lower chamber and an outlet port in the chamber directly above, the outlet port being at a level above the overflow level, and a steam outlet in the top chamber.

18. The steam generator of claim 17 further comprising a compression spring biasing means for holding said modules together.

19. The steam generator of claim 18 wherein said modules have a cylindrical shape.

20. The steam generator of claim 17 wherein said heating system has a feed water surface to power area ratio greater than 0.2 $ft^2/kW$.

21. The steam generator of claim 16 wherein said feed water is combined with less than 20% of liquid isopropyl alcohol.

22. A method of producing substantially pure steam for a subsequent process, the method comprising the steps of, (a) providing a plurality of interconnected, vertically stacked chambers in a steam generator, the generator having a top and a bottom chamber, each chamber having a sidewall and a bottom wall, (b) introducing feed water into the top chamber, (c) establishing a reservoir of feed water in each chamber and a downward cascading flow of overflow feed water through the sidewall of each of the chambers with any excess being released through a drain in the bottom chamber, (d) heating each reservoir of feed water to create steam in each chamber, (e) allowing the created steam to migrate upwardly through the sidewall collecting in the top chamber, (f) controllably releasing the collected steam from the top chamber, (g) maintaining the released steam at a temperature above the point of condensation, (h) filtering the released steam, and (i) delivering the filtered steam to a point of use.

23. The method of claim 22 further defined by cleaning semiconductor wafer surfaces at said point of use.

24. A steam generating process comprising the steps of, (a) providing a vertically-stacked, multi-chambered steam generator, the generator having a top and a bottom chamber, with each chamber having a sidewall and a bottom wall, (b) introducing feed water into the top chamber, (c) establishing a reservoir of feed water in each chamber and a downward cascading flow of overflow feed water through the sidewall of each of the chambers with any excess being released by drain means in the bottom chamber, (d) heating the reservoir of feed water in each chamber to create steam, (e) allowing the created steam to collect in the top chamber, and (f) controllably releasing the steam from the top chamber.

25. The method of claim 24 further comprising, mixing the steam released from the top chamber with an inert carrier gas in a supply line that is maintained at a temperature above the point of condensation, and filtering the mixed steam and inert gas.

* * * * *